United States Patent
Chung et al.

(10) Patent No.: US 6,444,524 B1
(45) Date of Patent: Sep. 3, 2002

(54) METHOD FOR FORMING A TRENCH CAPACITOR

(75) Inventors: Jesse Chung, Taichung; Sheng-Fen Chiu; Hsiao-Lei Wang, both of Taichun, all of (TW)

(73) Assignee: ProMos technologies, Inc., Hsinchu (TW)

( * ) Notice: Subject to any disclaimer, the term of this patent is extended or adjusted under 35 U.S.C. 154(b) by 26 days.

(21) Appl. No.: 09/659,511

(22) Filed: Sep. 11, 2000

(51) Int. Cl.⁷ .............................................. H01L 21/336
(52) U.S. Cl. ........................ 438/259; 438/702; 438/243
(58) Field of Search .................................. 438/259, 945, 438/702, 243, 248

(56) References Cited

U.S. PATENT DOCUMENTS

| | | | |
|---|---|---|---|
| 4,859,622 A | * | 8/1989 | Eguchi ........................ 438/243 |
| 5,909,044 A | * | 6/1999 | Chakravarti et al. ........ 257/301 |
| 6,214,686 B1 | * | 4/2001 | Divakaruni et al. ......... 438/386 |
| 6,303,466 B1 | * | 10/2001 | Shimonishi et al. ........ 438/424 |

* cited by examiner

*Primary Examiner*—Caridad Everhart
(74) *Attorney, Agent, or Firm*—Finnegan, Henderson, Farabow Garrett & Dunner, L.L.P.

(57) ABSTRACT

A method for manufacturing a deep trench capacitor, which includes forming a layer of silicon nitride over a silicon substrate, depositing a layer of borosilicate glass having a predetermined thickness over the layer of silicon nitride, patterning and defining the layer of borosilicate glass to expose two regions of the silicon substrate separated by a sacrificial mask, wherein the sacrificial mask includes the layer of borosilicate glass and the layer of silicon nitride, etching the two regions of the silicon substrate to form two trenches, wherein the predetermined thickness of the layer of borosilicate glass allows the sacrificial mask and a portion of the silicon substrate beneath the sacrificial mask to be removed, depositing a layer of silicon nitride on the sidewalls of the trenches, and depositing doped polysilicon into the trenches to form a single capacitor.

13 Claims, 5 Drawing Sheets

METHOD FOR FORMING A TRENCH CAPACITOR

BACKGROUND OF THE INVENTION

1. Field of the Invention

This invention pertains in general to a method for manufacturing a semiconductor device and, more particularly, to a method for manufacturing trench capacitors.

2. Description of the Related Art

Trench capacitors have been developed as an alternative to planar and stacked capacitors in dynamic random access memory (DRAM) cells because trench capacitors provide comparatively large capacitance while occupying a comparatively small area on a semiconductor chip surface. Trench capacitors are characterized by deep and narrow trenches in the semiconductor substrate. An insulator formed on the trench walls serves as the capacitor dielectric. Capacitor plates are formed on either side of the insulator, and one of the plates is formed by refilling the trench with doped polysilicon. The capacitance (C) of a trench capacitor is determined as follows:

$$C = \frac{\epsilon A}{d}$$

where $\epsilon$ is the permittivity of the capacitor dielectric, A is the capacitor area, and d is the thickness of the capacitor dielectric. From the foregoing relationship, the capacitance of a trench capacitor may be increased by forming a trench capacitor having a large area (A), or a thin capacitor dielectric (d).

One way to obtain a large capacitor area is to increase the depth of the trench capacitor. However, the circumference of the trench capacitor limits the depth of the trench that can be formed. In the manufacturing process of a trench capacitor, a mask that defines the circumference of the trench capacitor, is provided over the silicon wafer. An example of such a mask includes a combination of a silicon nitride ($Si_xH_y$, wherein x and y are integers, e.g., $Si_3H_4$) layer and a borosilicate glass (BSG) layer. The mask is then patterned to remove portions of the mask to expose a defined silicon substrate region. This is followed with reactive ion etching (RIE) to form a trench. The BSG layer is removed during the RIE process. FIG. 1 shows a trench formed in a silicon substrate 2 with a remaining layer of silicon nitride 4 as a mask.

The trench is doped with impurities, such as arsenic, to make the trench sidewalls conductive, thereby forming one plate of a capacitor. A thin layer of sacrificial thermal oxide may be grown on the sidewalls to remove silicon damaged by the higher-energy ions used to etch the trench during the RIE process to provide smooth trench sidewalls. The optional thermal oxide layer may be removed with a diluted hydrogen fluoride (HF) solution. A layer of silicon nitride ($Si_xH_y$) is deposited on the sidewalls using a chemical vapor deposition (CVD) process. The trench is then refilled with polysilicon doped with impurities such as phosphorus to form the other plate of the capacitor.

During the manufacturing of a DRAM product, however, a plurality of trench capacitors are formed. FIG. 2 shows the formation of a mask over silicon substrate 2 with a layer of silicon nitride 4 and a layer of BSG 6. FIG. 3 shows the forming of two trenches after the RIE process with the silicon nitride layer 4 and BSG layer 6 as a mask. BSG layer 6 is removed during the RIE process. Upon further processing according to the manufacturing process described above, these trenches will eventually become two trench capacitors.

As the density of DRAM products increases, the space between trench capacitors decreases. Furthermore, to achieve high capacitance, the trench capacitors are formed with increasing depths, which require longer etch time. However, bombardment by high-energy ions for an extended period of time during the RIE process may also remove portions of the silicon nitride layer, resulting in nitride faceting. This is shown in FIG. 4, which shows the removal of a portion of nitride layer 4A between two trenches. In situations involving excessive etching of the nitride layer in which a portion of the substrate between trenches is also removed, an electrical short is created between the neighboring trench capacitors when doped polysilicon is deposited to refill the trenches. To avoid an electrical short of neighboring trench capacitors, and minimize nitride faceting, the BSG layer generally has a thickness of at least 6500 Å.

SUMMARY OF THE INVENTION

Accordingly, the present invention is directed to a method for manufacturing trench capacitors that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawings.

To achieve these and other advantages, and in accordance with the purpose of the invention as embodied and broadly described, there is provided a method for manufacturing a trench capacitor that includes forming a layer of silicon nitride over a silicon substrate, depositing a layer of borosilicate glass having a predetermined thickness over the layer of silicon nitride, patterning and defining the layer of borosilicate glass to expose two regions of the silicon substrate separated by a sacrificial mask, wherein the sacrificial mask includes the layer of borosilicate glass and the layer of silicon nitride, etching the two regions of the silicon substrate to form two trenches, each having sidewalls, and etching the sacrificial mask, wherein the predetermined thickness of the layer of borosilicate glass permits the sacrificial mask and a portion of the silicon substrate beneath the sacrificial mask to be removed, depositing a layer of silicon nitride on the sidewalls of the trenches, and depositing polysilicon into the trenches to form a single capacitor.

In one aspect of the invention, the step of depositing a layer of borosilicate glass having a predetermined thickness includes a step of depositing a layer of borosilicate glass having a thickness of approximately 6500 Å.

Also in accordance with the present invention, there is provided a method for manufacturing a deep trench capacitor that includes defining a silicon substrate a surface, forming a layer of silicon nitride over the surface of the silicon substrate, depositing a layer of borosilicate glass having a predetermined thickness over the layer of silicon nitride, patterning and defining the layer of borosilicate glass to expose two regions of the surface of the silicon substrate separated by a sacrificial mask, wherein the sacrificial mask includes the layer of borosilicate glass and the layer of silicon nitride, the sacrificial mask has a higher etch rate than the remaining portions of the patterned and defined layers of silicon nitride and borosilicate glass, etching the two regions of the surface of the silicon substrate to form two trenches, wherein the two trenches are separated by a portion of silicon substrate having a height below the surface of the silicon substrate, depositing a layer of silicon nitride on the sidewalls of the trenches to form a dielectric layer, and depositing doped polysilicon into the trenches to form a single capacitor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DETAILED DESCRIPTION OF THE PREFERRED EMBODIMENTS

In accordance with the present invention, there is provided a method for manufacturing a trench capacitor having increased capacitor area, and therefore increased capacitance. Specifically, the method of the present invention uses the thickness of a mask layer to control the formation of a single trench capacitor from two trenches.

Figure 1:
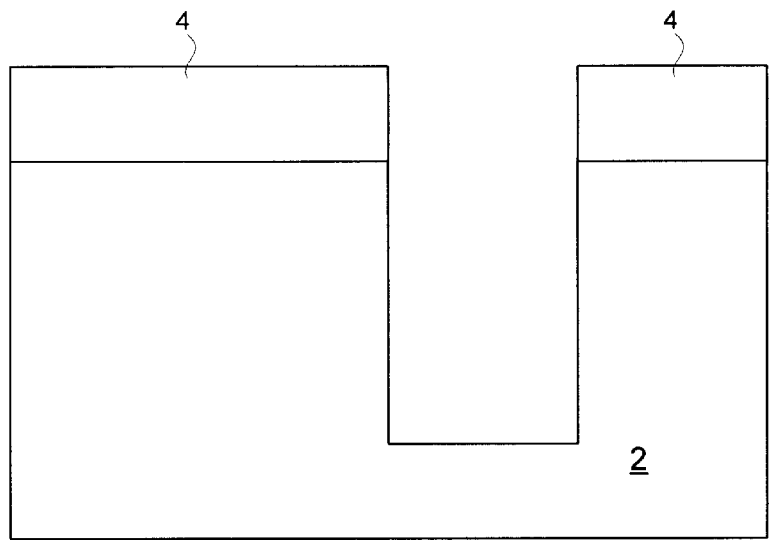
FIG. 1 shows the formation of a trench with a conventional method.
Figure 2:
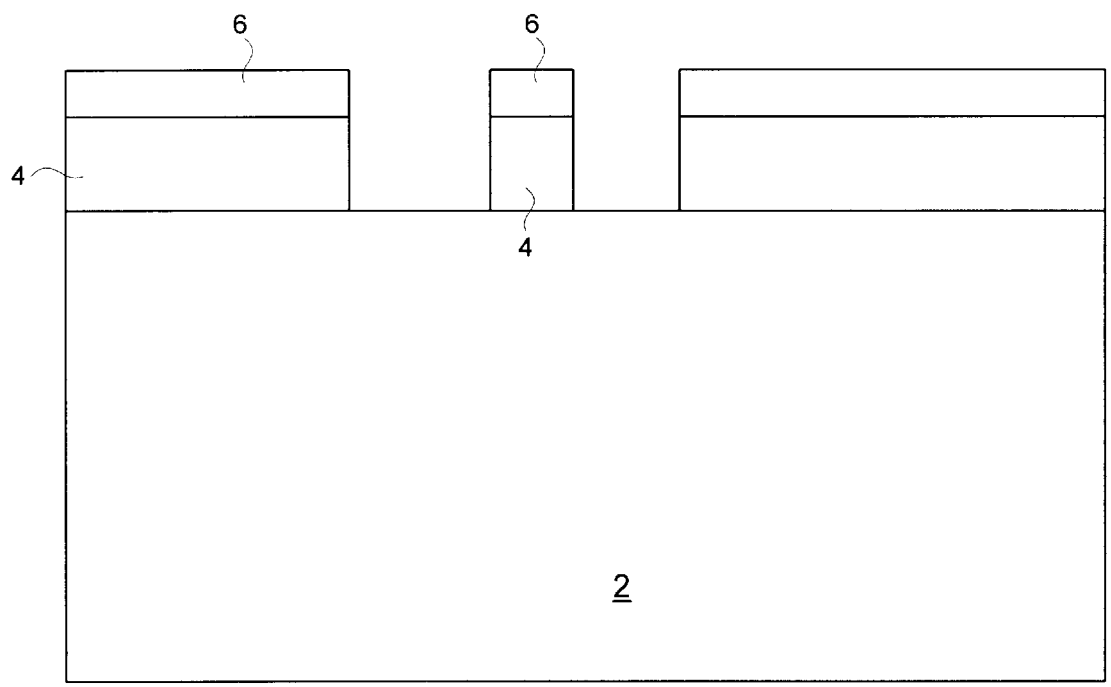
FIG. 2 shows one step of a conventional manufacturing process for trench capacitors after a mask has been patterned and defined.
Figure 3:
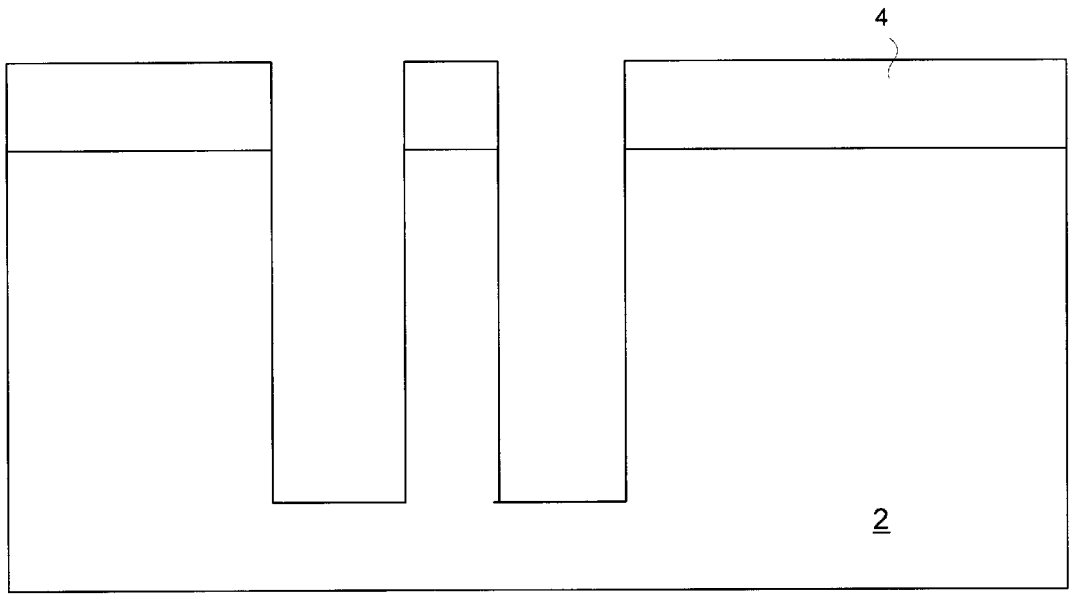
FIG. 3 shows the formation of two trenches with a conventional process.
Figure 4:
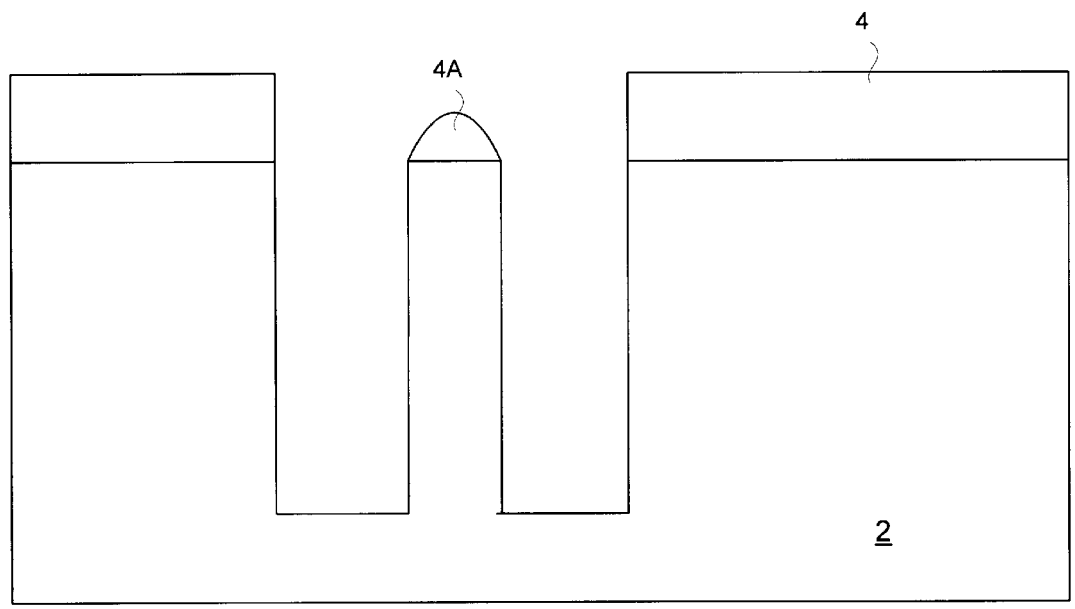
FIG. 4 shows the formation of two trenches with nitride faceting.
Figure 5A:
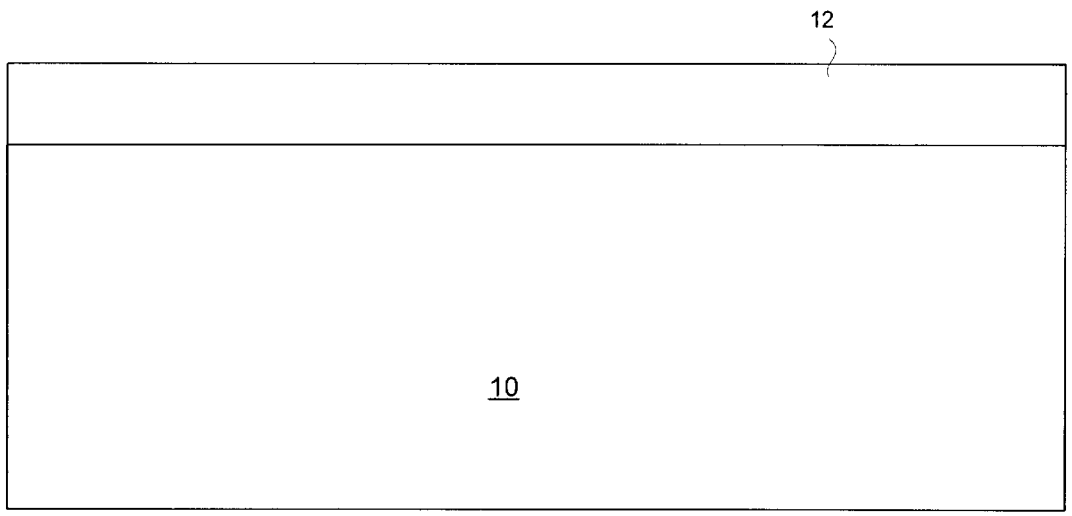
FIGS. 5A–5E show the manufacturing process for forming a trench capacitor in accordance with the present invention.
Figure 5B:
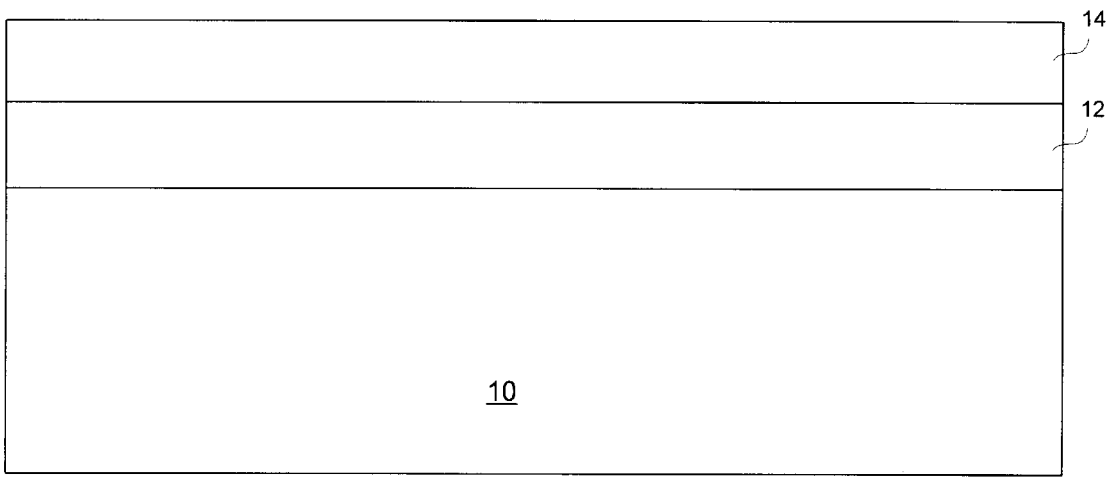
Figure 5C:
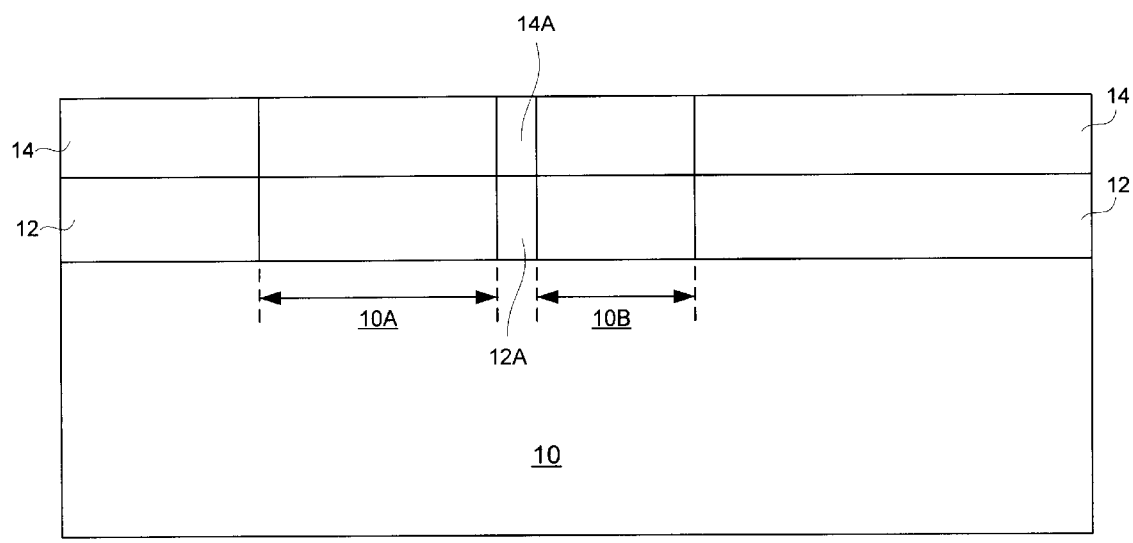

FIGS. 5A–5E show the manufacturing process for forming a trench capacitor in accordance with the present invention. Referring to FIG. 5A, after a silicon substrate 10 is defined, a layer of silicon nitride 12 is formed over silicon substrate 10. Silicon nitride layer 12 may be grown or deposited with a CVD process. Referring to FIG. 5B, a layer of BSG 14 is then deposited over silicon nitride layer 12. BSG layer 14 should be thinner than 6500 Å. In one embodiment, BSG layer 14 has a thickness of approximately 5500 Å. The layers of silicon nitride and BSG comprise a mask over silicon substrate 10 to form trenches in silicon substrate 10. Referring to FIG. 5C, the mask is patterned and defined to expose two regions 10A and 10B of the silicon substrate. Specifically, the mask defines the circumference of the trenches. The two regions of silicon substrate 10A and 10B are separated by a mask comprising of nitride layer 12A and BSG layer 14A. In one embodiment of the invention, the width of the mask separating silicon substrates 10A and 10B is approximately 50 nm.

Figure 5D:
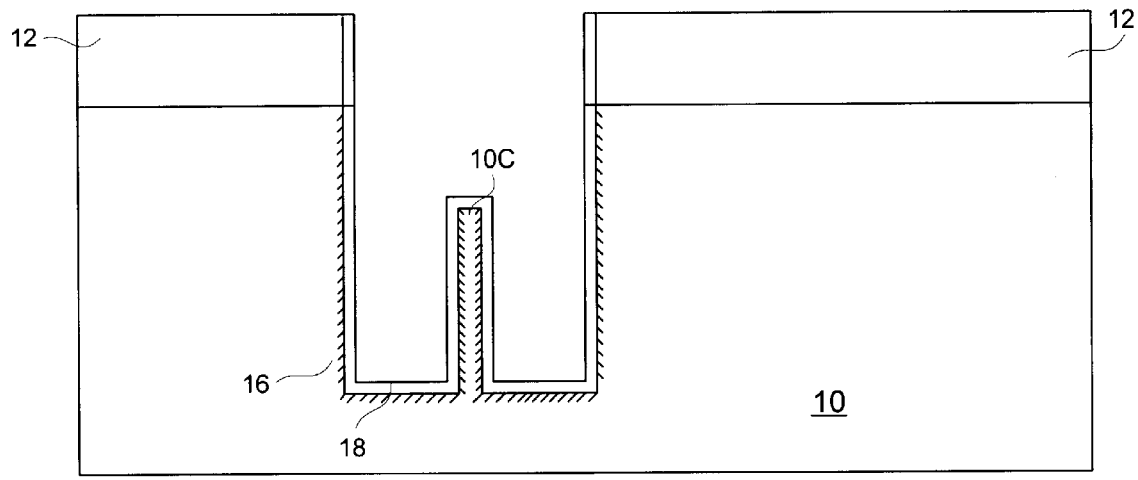

The silicon substrate is etched to form two trenches. The etching may be performed with isotropic dry etch, such as RIE. As shown in FIG. 5D, during the etching process, BSG layer 14, BSG layer 14A, silicon nitride layer 12A, and a portion of silicon substrate 10 beneath silicon nitride layer 12A are all removed, together with silicon substrate regions 10A and 10B. During the etching process, the thickness of the BSG layer 14, specifically BSG layer 14A, allows BSG layer 14A to be removed quickly. BSG layer 14A has a higher etch rate than BSG layer 14. After BSG layer 14A is removed, silicon nitride layer 12A is exposed to the high-energy ions because the trenches will not have been fully formed. The narrowness of silicon nitride layer 12A renders silicon nitride layer 12A conducive to being removed by the bombardment of the high-energy ions. In other words, silicon nitride layer 12A exhibits a higher etch rate than silicon nitride layer 12. After silicon nitride layer 12A is removed, a portion of silicon substrate 10 directly beneath silicon nitride layer 12A is exposed to the high-energy ions. As a result, a portion of silicon substrate 10 is removed during etching, forming silicon substrate 10C. The top of silicon substrate 10C is below the surface of silicon substrate 10. In one embodiment of the invention, the top of silicon substrate 10C is about 1.3 $\mu$m below the top of silicon nitride layer 12. The depth of the trench is approximately 7 to 8 $\mu$m.

The sidewalls of the trenches are doped with impurities, such as arsenic. The impurities diffuse into the sidewalls, rendering the sidewalls conductive, to form one plate 16 of a trench capacitor. A thin layer of sacrificial thermal oxide may be grown on the sidewalls to remove silicon damage by the higher-energy ions during the RIE process and provide smooth trench sidewalls. The optional thermal oxide layer may be removed with a diluted hydrogen fluoride (HF) solution. A layer 18 of silicon nitride and oxide is deposited on the sidewalls using an LPCVD process to form the dielectric layer of the trench capacitor.

Figure 5E:
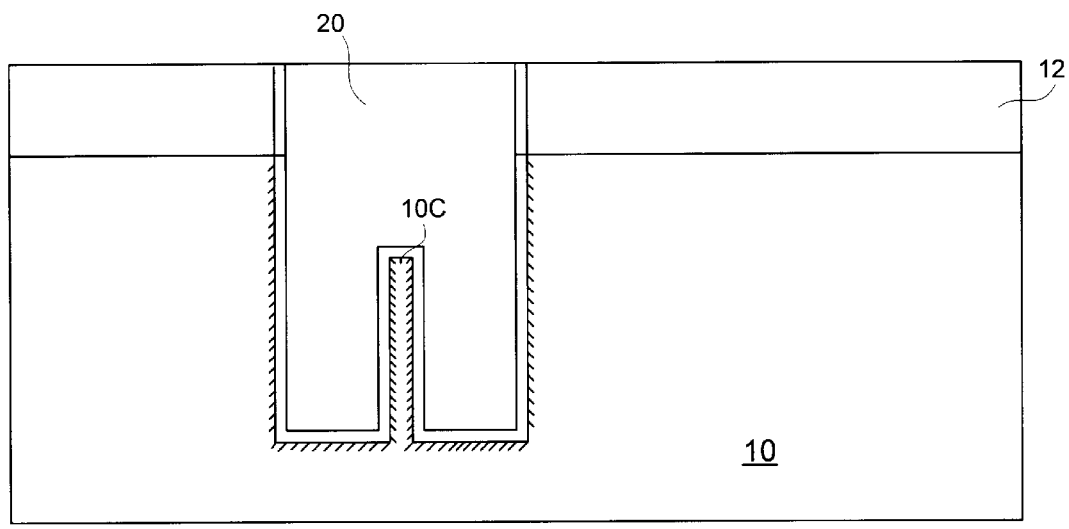

Referring to FIG. 5E, the trenches are refilled with polysilicon doped with impurities such as phosphorus to form the other plate 20 of the trench capacitor. Conventional manufacturing process then follows to form the contacts and other active devices. The trench capacitor shown in FIG. 5E has an increased capacitance because it has an increased capacitor area represented by surface area of silicon substrate 10C.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for manufacturing a deep trench capacitor, comprising:

defining a silicon substrate;

forming a layer of silicon nitride over the silicon substrate;

depositing a layer of borosilicate glass having a predetermined thickness over the layer of silicon nitride;

patterning and defining the layer of borosilicate glass to expose two regions of the silicon substrate separated by a sacrificial mask, wherein the sacrificial mask includes the layer of borosilicate glass and the layer of silicon nitride;

etching the two regions of the silicon substrate to form two trenches, each having sidewalls, wherein the predetermined thickness of the layer of borosilicate glass allows the sacrificial mask and a portion of the silicon substrate beneath the sacrificial mask to be removed;

depositing a layer of silicon nitride on the sidewalls of the trenches to form a dielectric layer; and depositing doped polysilicon into the trenches to form a single capacitor.

2. The method as claimed in claim 1, wherein the etching step includes a step of reactive ion etching.

3. The method as claimed in claim 1, wherein the sacrificial mask has a width of approximately 50 nm.

4. The method as claimed in claim 1, wherein the step of depositing a layer of borosilicate glass includes a step of depositing a layer of borosilicate glass having a thickness of approximately 5500 Å.

5. The method as claimed in claim 1, wherein the step of forming a layer of silicon nitride over a silicon substrate includes a step of depositing a layer of silicon nitride.

6. The method as claimed in claim 1, wherein the step of forming a layer of silicon nitride over a silicon substrate includes a step of growing a layer of silicon nitride.

7. The method as claimed in claim 1, wherein the height of the portion of silicon substrate separating the two trenches is approximately 1.3 $\mu$m below the layer of silicon nitride deposited over the silicon substrate.

8. A method for manufacturing a deep trench capacitor, comprising:

defining a silicon substrate a surface;

forming a layer of silicon nitride over the surface of the silicon substrate;

depositing a layer of borosilicate glass having a predetermined thickness over the layer of silicon nitride;

patterning and defining the layer of borosilicate glass to expose two regions of the surface of the silicon substrate separated by a sacrificial mask, wherein the sacrificial mask includes the layer of borosilicate glass and the layer of silicon nitride, the sacrificial mask having a higher etch rate than remaining portions of the patterned and defined layers of silicon nitride and borosilicate glass;

etching the two regions of the surface of the silicon substrate to form two trenches, wherein the two trenches are separated by a portion of silicon substrate having a height below the surface of the silicon substrate;

depositing a layer of silicon nitride on the sidewalls of the trenches to form a dielectric layer; and depositing doped polysilicon into the trenches to form a single capacitor.

9. The method as claimed in claim 8, wherein the etching step includes a step of reactive ion etching.

10. The method as claimed in claim 8, wherein the step of forming a layer of silicon nitride over a silicon substrate includes a step of depositing layer of silicon nitride.

11. The method as claimed in claim 8, wherein the sacrificial mask has a width of approximately 50 nm.

12. The method as claimed in claim 8, wherein the step of forming a layer of silicon nitride over a silicon substrate includes a step of growing a layer of silicon nitride.

13. The method as claimed in claim 8, wherein the height of the portion of silicon substrate separating the two trenches is approximately 1.3 $\mu$m below the layer of silicon nitride deposited over the silicon substrate.

* * * * *